United States Patent
Goto et al.

[11] Patent Number: 6,080,969
[45] Date of Patent: Jun. 27, 2000

[54] APPARATUS FOR AND METHOD OF THERMALLY PROCESSING SUBSTRATE

[75] Inventors: Hiroyasu Goto, Ibaragi; Akihiro Hisai, Kyoto; Minobu Matsunaga, Kyoto; Hiroshi Kobayashi, Kyoto, all of Japan

[73] Assignees: SMC Corporation; Dainippon Screen Mfg., Co., Ltd., both of Japan

[21] Appl. No.: 09/085,631

[22] Filed: May 27, 1998

[30] Foreign Application Priority Data

May 29, 1997 [JP] Japan ................................ 9-140492

[51] Int. Cl.[7] .............................. H05B 3/68; C23C 16/00
[52] U.S. Cl. ....................................... 219/444.1; 118/724
[58] Field of Search .............................. 219/444.1, 445.1, 219/446.1; 118/724, 725; 62/3.2, 3.3, 3.7

[56] References Cited

U.S. PATENT DOCUMENTS

| | | | |
|---|---|---|---|
| 3,635,037 | 1/1972 | Hubert | 63/3.2 |
| 5,084,671 | 1/1992 | Miyata et al. | 324/760 |
| 5,151,871 | 9/1992 | Matsumura et al. | 219/444.1 |
| 5,216,887 | 6/1993 | Kadotani et al. | 62/3.2 |
| 5,854,468 | 12/1998 | Muka | 219/444.1 |
| 5,927,077 | 7/1999 | Hisai et al. | 219/444.1 |

*Primary Examiner*—Sang Paik
*Attorney, Agent, or Firm*—Ostrolenk, Faber, Gerb & Soffen, LLP

[57] ABSTRACT

A substrate thermal processing apparatus easily changes a set temperature at which a substrate is set while thermally processed. A heating plate of the substrate thermal processing apparatus comprises a substrate supporting plate which supports a substrate, an auxiliary heating portion and a main heating portion, and a cooling Peltier element and a water cooling jacket. For heating a substrate, heat which is generated at the main heating portion which comprises a heater portion is transmitted to the substrate supporting plate through the auxiliary heating portion which comprises a Peltier element, so that the substrate is heated up. When the temperature of the substrate supporting plate is to be decreased, the auxiliary heating portion and the cooling Peltier element guide the heat of the substrate supporting plate to the water cooling jacket, and the heat is discharged outside by cooling water.

6 Claims, 7 Drawing Sheets

APPARATUS FOR AND METHOD OF THERMALLY PROCESSING SUBSTRATE

BACKGROUND OF THE INVENTION

1. Field of the Invention

The present invention relates to a substrate thermal processing apparatus for processing a substrate.

2. Description of the Background Art

During processing of a substrate such as a semiconductor wafer, a glass substrate for photomask, a glass substrate for liquid crystal display and a substrate for optical disk, a substrate thermal processing apparatus, e.g., a substrate heating apparatus which heats up a substrate which seats a resist film to a predetermined temperature, and a substrate cooling apparatus which cools the heated substrate down to a predetermined temperature, are used.

Figure 7:
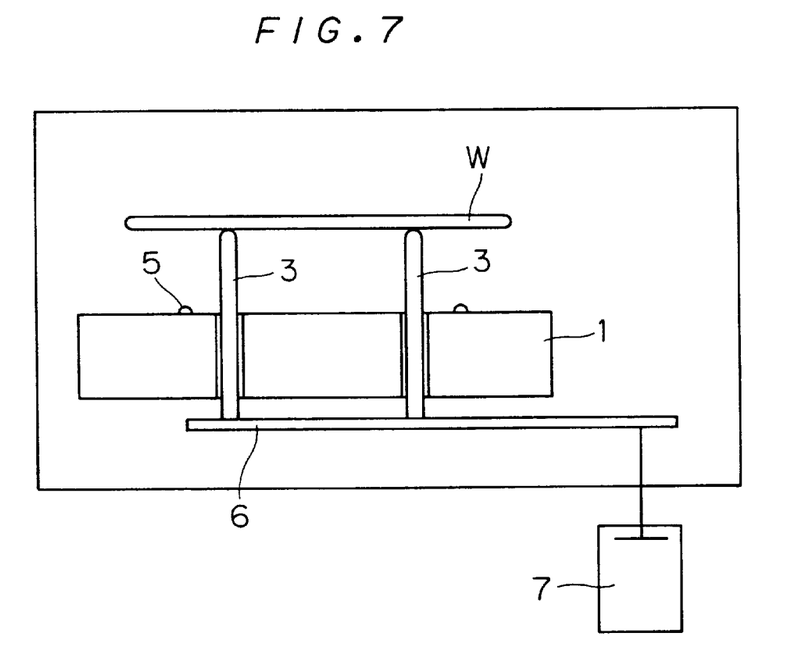
FIG. 7 is a schematic diagram showing a principal portion of a conventional substrate heating apparatus.

FIG. 7 is a schematic diagram showing a principal portion of a conventional substrate heating apparatus. In FIG. 7, the substrate heating apparatus comprises a heating plate 1 for heating up a substrate W to a predetermined temperature. Inside the heating plate 1, a heat source such as a mica heater is buried. Further, a plurality of ball-like shaped spacers 5 for supporting a substrate W at a bottom surface of the substrate W are disposed in a top surface of the heating plate 1.

Disposed below the heating plate 1 are three elevating pins 3 and an elevating frame 6 which is linked to the elevating pins 3. A cylinder 7 is linked to one end of the elevating frame 6, so that a substrate W is moved upward and downward by the three elevating pins 3 as a rod of the cylinder 7 expands and contracts.

The substrate heating apparatus as described above is used for heating processing prior to exposure of, for example, a resist film which is formed on a substrate (prebake processing), heating processing after exposure (PEB: Post Exposure Bake), heating processing after developing (postbake processing), etc. An external substrate transport device supplies substrates W sequentially to the substrate heating apparatus at constant time intervals.

Figure 8:
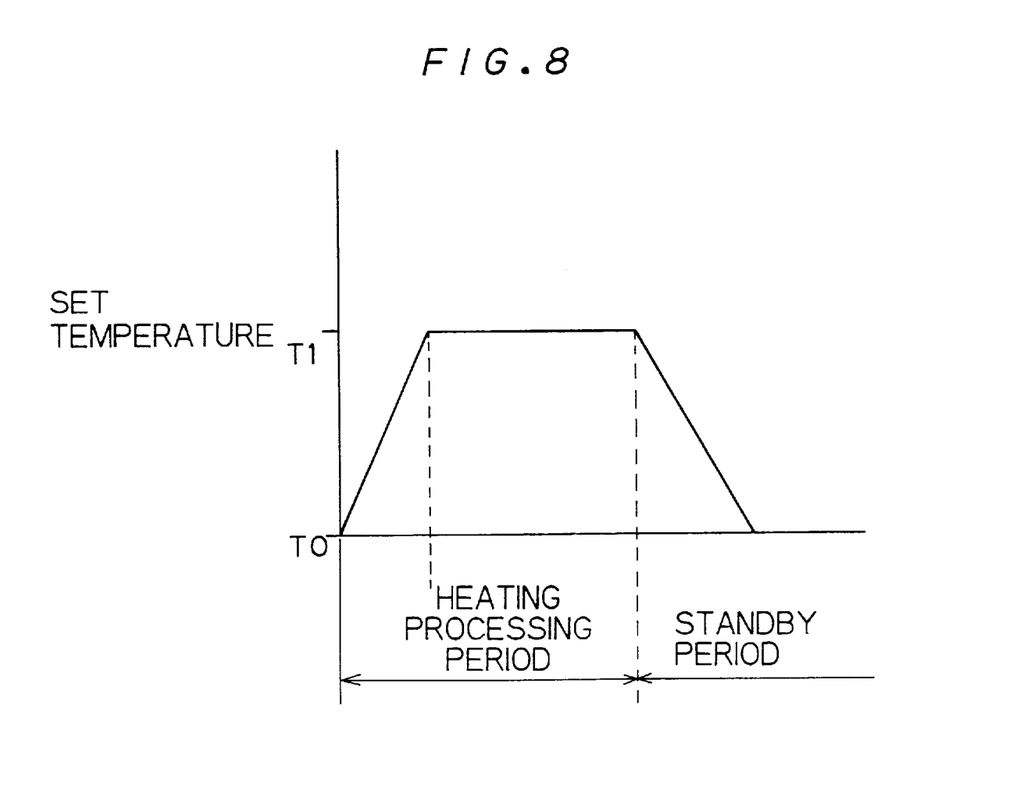
FIG. 8 is a view showing a heat history of a substrate in the substrate heating apparatus which is shown in FIG. 7.

FIG. 8 is a view showing a heat history of a substrate in the substrate heating apparatus which is shown in FIG. 7. In FIG. 8, as a substrate W on which a resist film is formed is mounted on the heating plate 1 which is disposed within the substrate heating apparatus, the temperature of the substrate W is increased to a predetermined set temperature T1, e.g., 110° C., from around a room temperature. The substrate W is thereafter maintained at the set temperature T1 during a predetermined heating processing period, and is taken out to outside after a certain standby period.

Recent years have seen use of various types of resists in accordance with characteristics of patterns which are formed on a substrate W. The set temperature T1 of a substrate W in a thermal processing in the substrate heating apparatus is different depending on the type of a resist. Hence, where substrates W which are coated with different types of resists are supplied successively, it is desired to change the set temperature T1 for a supplied substrate W instantly in accordance with the type of a resist of the supplied substrate W before heating the substrate W.

In the conventional substrate heating apparatus, an output from the heat source, such as a mica heater, which is disposed within the heating plate 1 is controlled so as to adjust the set temperature T1. Therefore, when the set temperature T1 for the next substrate W is lower than the set temperature T1 for the immediately preceding substrate W, it is necessary to control an output from the heat source of the heating plate 1 to thereby decrease a surface temperature of the heating plate 1.

However, the heating plate 1 does not comprise cooling means. Because of this, natural heat radiation is the only way to decrease the temperature of the heating plate 1. Contradicting this, since the substrate heating apparatus is internally kept at a high temperature, a cooling effect of natural heat radiation is extremely small. Hence, the surface temperature of the heating plate 1 does not decrease easily, which makes it difficult to successively process substrates W for which the set temperature T1 is different.

Against this background, a plurality of substrate heating apparatuses are disposed, corresponding to the types of the set temperature T1 for substrates W, for the purpose of heating processing. This requires a number of substrate heating apparatuses and pushes up a facilities cost.

SUMMARY OF THE INVENTION

The present invention directed to a method of performing thermal processing on a substrate, comprising: a) a step of obtaining an apparatus which comprises a supporting stage for supporting a substrate, a heating portion which is disposed below the supporting stage, and first heat exchange means which is disposed below the supporting stage and the heating portion to exchange heat between the supporting stage and the heating portion; b) a temperature controlling step of controlling a temperature of the substrate, the temperature controlling step comprising: a first measuring step of measuring a temperature of the supporting stage to obtain a first measured temperature; a first comparison step of comparing the first measured temperature with a first target temperature to obtain a first comparison result; and a first controlling step of driving the first heat exchange means in accordance with the first comparison result and controlling a heat transfer direction between the supporting stage and the heating portion.

The heating portion develops heat during heating processing, and the heat is transmitted to the supporting stage by the first heat exchange means so that the supporting stage is set to the first target temperature. This keeps a substrate which is supported on the supporting stage at a predetermined set temperature.

Further, when the set temperature for a substrate is to be changed to a lower temperature, the first heat exchange means transfers the heat of the supporting stage toward the cooling portion. The cooling portion discharges the transferred heat outside. This rapidly decreases the temperature of the supporting stage. Hence, it is possible to continuously process a substrate for which the set temperature for heating is high and a substrate for which the set temperature for heating is low, with the same apparatus. This reduces a cost for a facility which is needed for the heating processing, and improves the efficiency of the processing.

Preferably, the first heat exchange means comprises a Peltier element, and the first controlling step comprises a step of reversing the direction of a current which is supplied to the Peltier element to thereby reverse the heat transfer direction between the supporting stage and the heating portion. Thus, the first heat exchange means comprises a Peltier element, and the Peltier element switches the direction of the supplied current so that heat of the heating portion is transferred toward the supporting stage or heat of the supporting stage is transferred toward the heating portion. This makes it possible to adjust the temperature of the supporting stage accurately to a predetermined temperature.

The cooling portion may comprise a cooling member which contacts a bottom surface of the heating portion, a pipe being formed through the cooling member, and the apparatus may further comprise coolant supply means which supplies a coolant to the pipe.

The coolant, preferably air, which passes through the pipe which is formed within the cooling member receives heat which is transmitted from the supporting stage through the heating portion and discharges the heat outside. This quickly decreases the temperature of the supporting stage.

Preferably, the heating portion comprises: a heater; a top heat transfer member which is stacked on a top surface side of the heater; and a bottom heat transfer member which is stacked on a bottom surface side of the heater.

Thus, the top and the bottom heat transfer members equalizes heat and transmit the heat. The top heat transfer member which is disposed on the top surface side of the heater, in particular, receives heat from the heater, equalizes the heat and transmits the heat to the supporting stage which is disposed above. This increases the temperature of the top surface of the supporting stage uniformly.

The heating portion may comprise a heat generating member with a heater is buried inside.

Thus, as the heater which is disposed within the heat generating member develops heat, the temperature of the heat generating member increases, which in turn increases the temperature of the supporting stage which is disposed above to a predetermined temperature.

The apparatus may further comprise a cooling portion which is disposed below the heating portion and second heat exchange means which is disposed between the heating portion and the cooling portion, and the temperature controlling step may comprise a second controlling step of driving the second heat exchange means in accordance with the first comparison result and controlling the heat transfer direction between the heating portion and the cooling portion.

The heating portion develops heat during heating processing, and the heat is transmitted to the supporting stage by the first heat exchange means so that the supporting stage is set to the first target temperature. As a result, exposed to the heat which is radiated from the supporting stage, a substrate which is supported on the supporting stage is maintained at a predetermined set temperature.

The first heat exchange means transfer heat between the supporting stage and the heating portion to control the temperature of the supporting stage to the first target temperature. As a result, the temperature of a substrate on the supporting stage is accurately maintained at a predetermined set temperature.

Further, when the set temperature for a substrate is to be changed to a lower temperature, the first heat exchange means transfer heat from the supporting stage toward the heating portion while the second heat exchange means transfers heat toward the cooling portion from the heating portion. The heat which is transmitted to the cooling portion is discharged outside. This rapidly decreases the temperature of the supporting stage.

Hence, it is possible to continuously process a substrate for which the set temperature for heating is high and a substrate for which the set temperature for heating is low, with the same apparatus. This reduces a cost for a facility which is needed for the heating processing, and improves the efficiency of the processing.

Preferably, the second heat exchange means comprises a Peltier element, and the second controlling step comprises a step of reversing the direction of a current which is supplied to the Peltier element to thereby reverse the heat transfer direction between the heating portion and the cooling portion.

The Peltier element transfers heat by a thermoelectric effect. Switching the direction of the supplied current, the Peltier element switches the direction in which heat is transferred. Hence, when the temperature of the supporting stage is to be increased, the Peltier element transfers heat of the heating portion toward the supporting stage. When the temperature of the supporting stage is to be decreased, the Peltier element transfers heat of the supporting stage toward the heating portion, and further, from the heating portion to the cooling portion. As a result, the temperature of the supporting stage is accurately set.

Preferably, the cooling portion comprises a cooling member which contacts a bottom surface of the second heat exchange member, a pipe being formed through the cooling member, and the apparatus further comprises coolant supply means which supplies a coolant to the pipe.

In this case, the coolant, preferably cooling water, is circulated within the tunnel which is formed within the cooling member, so that heat which is guided from the supporting stage is discharged outside through the coolant. This quickly decreases the temperature of the supporting stage.

Accordingly, an object of the present invention is to provide a substrate thermal processing apparatus which is capable of easily changing a set temperature for heating a substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
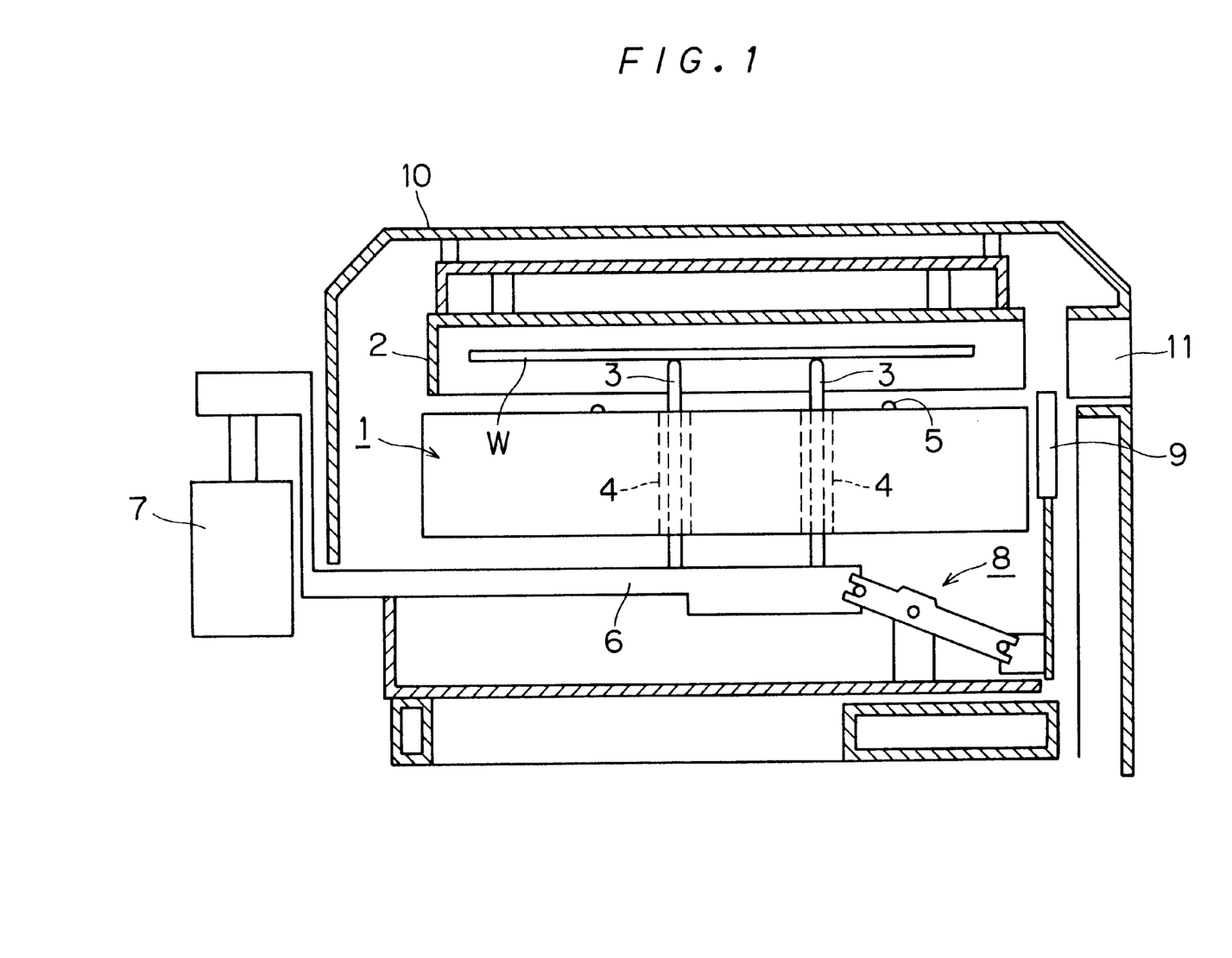
FIG. 1 is a cross sectional view of a substrate heating apparatus according to the present invention.

FIG. 1 is a cross sectional view of a substrate heating apparatus according to preferred embodiments of the present invention. The substrate heating apparatus comprises a heating plate 1, which heats up a substrate W, inside a housing 10. Three ball-like shaped spacers 5 for supporting a substrate W at a bottom surface of the substrate W are disposed in a top surface of the heating plate 1, in an equilateral triangular shape arrangement. Further, three through holes 4 are formed in the heating plate 1, for allowing three elevating pins 3 which move a substrate W upward and downward to pass through.

Above the heating plate 1, an upper cover 2 for covering the top surface of the heating plate 1 is attached to an internal top surface of the housing 10. Further, disposed in a bottom portion of the heating plate 1 are the three elevating pins 3, which support a substrate W at a bottom surface of the substrate W and move the substrate W upward and downward, and an elevating plate 6 which is linked to the elevating pins 3. A cylinder 7 is linked to one end of the elevating plate 6 outside the housing 10. The elevating plate 6 and the elevating pins 3 move upward and downward as a rod of the cylinder 7 expands and contracts. A substrate W stands by above the heating plate 1 when the elevating plate 6 and the elevating pins 3 move upward, whereas a substrate W is mounted on the ball-like spacers 5 which are disposed on the heating plate 1 when the elevating plate 6 and the elevating pins 3 move downward.

A substrate supply and discharge opening 11 is formed in a front face of the housing 10. A shutter 9 is disposed internally behind the substrate supply and discharge opening 11. A bottom end of the shutter 9 is linked to the elevating plate 6 by a linkage member 8. Hence, as the rod of the cylinder 7 expands, the elevating plate 6 moves upward, pushing up a substrate W to a standby position, while the shutter 9 moves downward, opening the substrate supply and discharge opening 11. Conversely, as the rod of the cylinder 7 contracts back into the cylinder 7, the elevating plate 6 moves downward, mounting a substrate W on the ball-like spacers 5, while the shutter 9 moves upward, closing the substrate supply and discharge opening 11.

Figure 2:
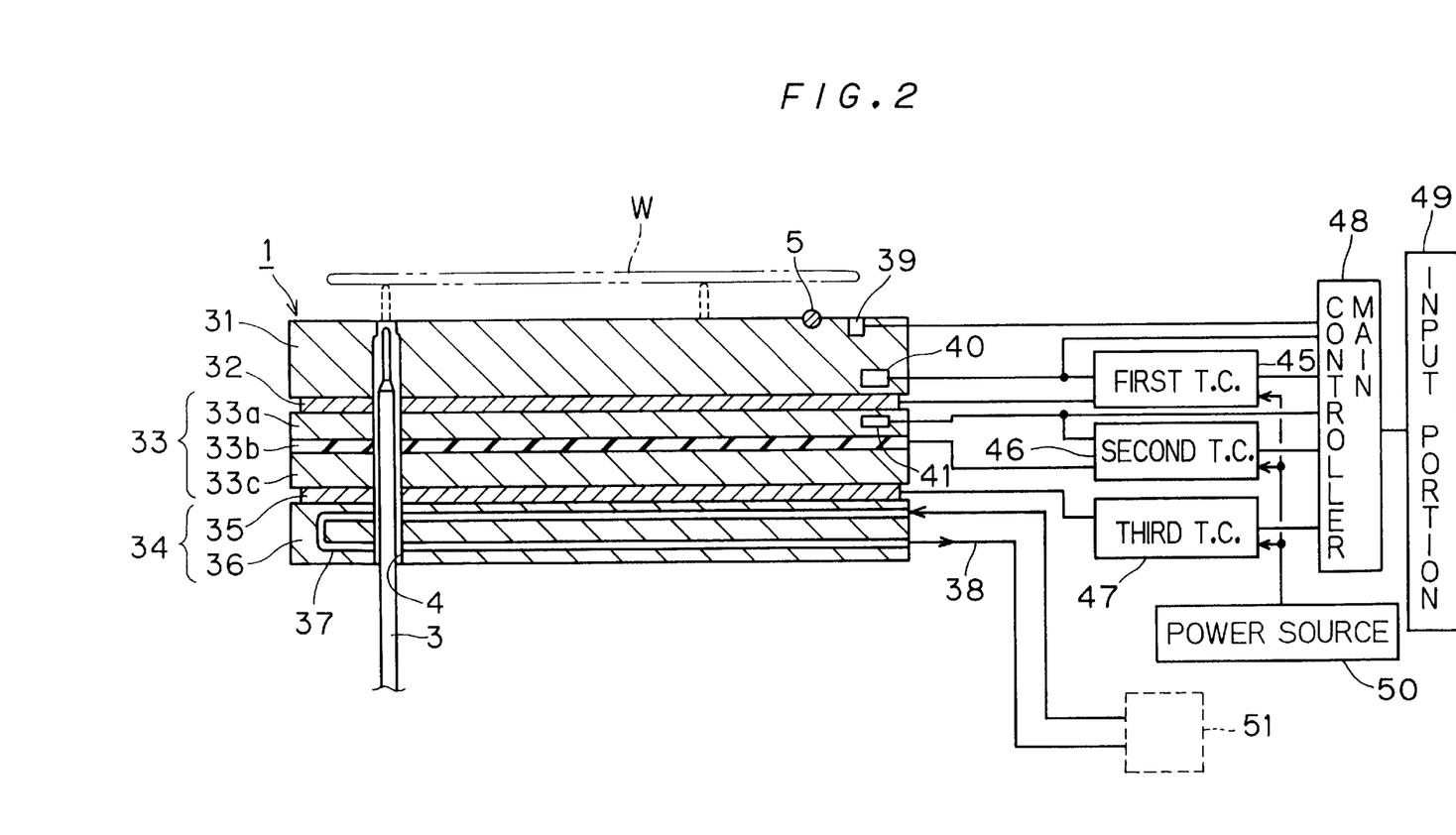
FIG. 2 is a cross sectional view of a heating plate according to a first preferred embodiment of the present invention.

Now, a structure of the heating plate 1 will be described. FIG. 2 is a cross sectional view of the heating plate according to a first preferred embodiment of the present invention. The heating plate 1 comprises a substrate supporting plate 31 which horizontally supports a substrate W, an auxiliary heating portion 32 which is disposed at a bottom surface of the substrate supporting plate 31, a main heating portion 33 which is disposed at a bottom surface of the auxiliary heating portion 32, and cooling means 34 which contacts a bottom surface of the main heating portion 33 and cools the substrate supporting plate 31 and the main heating portion 33.

The substrate supporting plate 31 is made of a material which has an excellent heat transfer characteristic, such as aluminum. The three ball-like shaped spacers 5 for supporting a substrate W are disposed in the top surface of the substrate supporting plate 31, in an equilateral triangular shape arrangement. As a surface temperature of the substrate supporting plate 31 is controlled to a predetermined temperature, the temperature of a substrate W which is supported above the substrate supporting plate 31 with a very small distance therebetween is adjusted to a predetermined set temperature.

The auxiliary heating portion 32 is formed by a Peltier element. When provided with a current, a Peltier element absorbs heat at one side surface while radiating heat at the other side surface. The Peltier element transfer heat in this manner. The direction of transfer of heat can be switched by switching the direction of the supplied current. Hence, when the temperature of the substrate supporting plate 31 is to be increased, the Peltier element transfers heat toward the substrate supporting plate 31 from the main heating portion 33. Conversely, when the temperature of the substrate supporting plate 31 is to be decreased, the Peltier element transfers heat from the substrate supporting plate 31 toward the main heating portion 33. The auxiliary heating portion 32, utilizing the Peltier element, can adjust the temperature of the substrate supporting plate 31 in a short period of time.

The main heating portion 33 comprises an intermediate plate 33a which is disposed in contact with the auxiliary heating portion 32, a heater portion 33b which is disposed in contact with a bottom surface of the intermediate plate 33a, and a heat radiating plate 33c which is disposed in contact with a bottom surface of the heater portion 33b. The heater portion 33b is formed by a mica heater. The intermediate plate 33a equalizes heat which is developed by the heater portion 33b and transfers the heat to the substrate supporting plate 31. Further, the heat radiating plate 33a is disposed in such a manner that heat from the heater portion 33b is discharged to the opposite side to the substrate supporting plate 31, that is, toward a downward direction.

The cooling means 34 comprises a cooling Peltier element 35 which cools the main heating portion 33, and a water cooling jacket 36 which discharges heat from the cooling Peltier element 35. The cooling Peltier element 35 is disposed in contact with a bottom surface of the heat radiating plate 33c of the main heating portion 33. During a temperature decrease operation which will be described later, the cooling Peltier element 35 absorbs heat from the heat radiating plate 33c so that the temperature of the heat radiating plate 33c decreases.

In the water cooling jacket 36, a cooling water channel 37 for circulating cooling water inside a plate-like shaped member which has an excellent heat transfer characteristic is disposed. The cooling water channel 37 is connected to a cooling water supply source 51 which is disposed in, for example, a factory in which the substrate heating apparatus is installed, through a circulating pipe 38.

Further disposed to the substrate supporting plate 31 is a substrate detecting sensor 39 which detects that a substrate W is loaded on the substrate supporting plate 31. An output from the substrate detecting sensor 39 is supplied to a main controller 48. Still further, a temperature sensor 40 is disposed to the substrate supporting plate 31. An output from the temperature sensor 40 is supplied to a first temperature controller (T.C.) 45.

A temperature sensor 41 is disposed to the intermediate plate 33a. An output from the temperature sensor 41 is supplied to a second temperature controller 46. The first and the second temperature controllers 45 and 46 control currents which are supplied to the auxiliary heating portion 32 and the heater portion 33b, respectively, from a power source 50. Further, a third temperature controller 47 controls a current which is supplied to the cooling Peltier element 35 from the power source 50. Operations of the first to the third temperature controllers 45 to 47 are controlled by the main controller 48.

The main controller 48 comprises a CPU (Central Processing Unit), a RAM (Random Access Memory), a ROM (Read Only Memory), and a microcomputer which comprises a counter for measuring time, etc. In addition, an input portion 49 which comprises a keyboard and the like for inputting a temperature control condition and the like is connected to the main controller 48.

The substrate supporting plate 31 corresponds to the substrate supporting stage according to the invention, the main heating portion 33 corresponds to the heating portion according to the invention, the water cooling jacket 36 corresponds to the cooling portion and the cooling member according to the invention, the auxiliary heating portion 32 corresponds to the first heat exchange means, and the cooling Peltier element 35 corresponds to the second heat exchange means.

Next, an operation of the substrate heating apparatus comprises the heating plate 1 which is shown in FIG. 2 will be described. The following description is about (1) a temperature setting operation of the substrate supporting plate, (2) a high speed temperature increase operation upon loading of a substrate, and (3) a set temperature changing (decreasing) operation.

(1) Temperature Setting Operation of Substrate Supporting Plate

Figure 3:
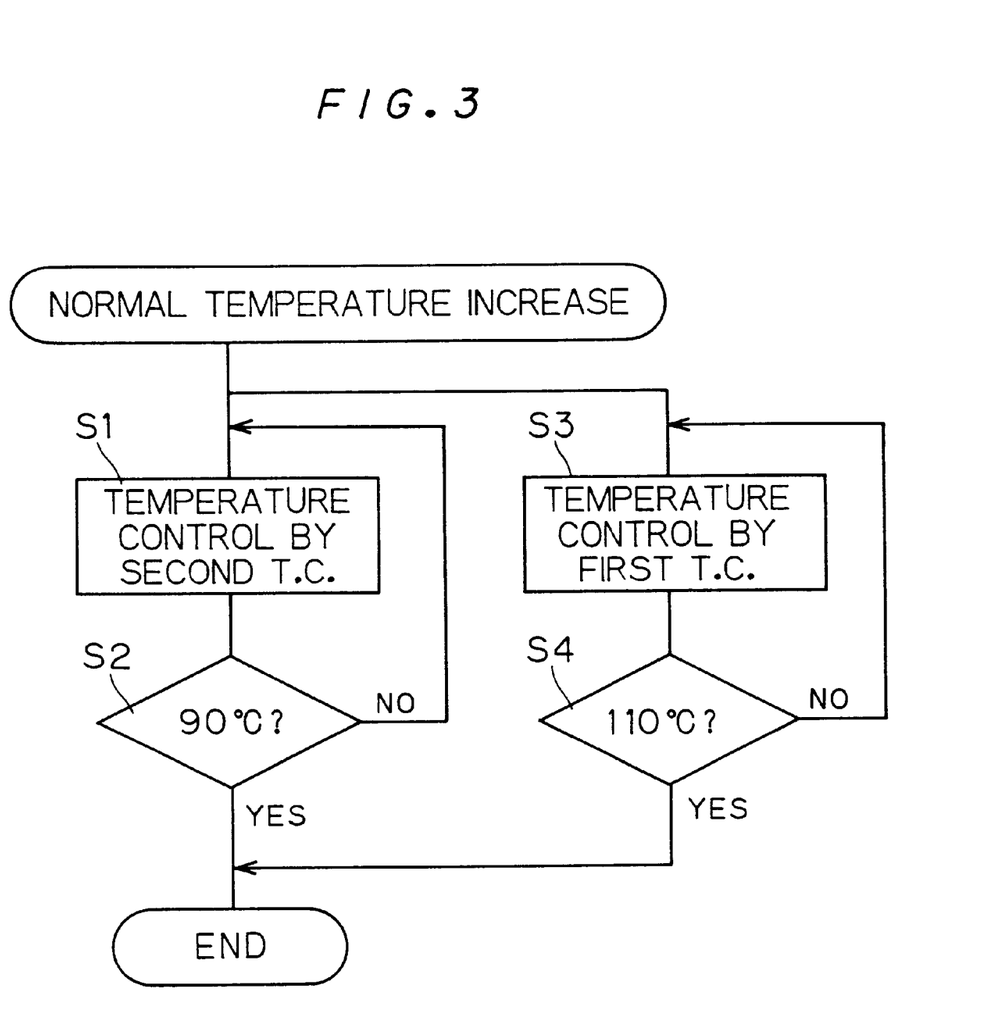
FIG. 3 is a flowchart showing a temperature setting operation in the substrate heating apparatus which comprises the heating plate which is shown in FIG. 2.

FIG. 3 is a flowchart showing the temperature setting operation in the substrate heating apparatus. The temperature of the top surface of the substrate supporting plate 31 is set at 110° C.

As shown in FIG. 3, before transporting a substrate W in, the heater portion 33b of the main heating portion 33 is driven, and processes at Step S1 and Step S2 are executed. At the same time, the auxiliary heating portion 32 is driven, and processes at Step S3 and Step S4 are executed.

In short, at Step S1, the second temperature controller 46 controls an amount of a current which is supplied to the heater portion 33b from the power source 50, so that a heater of the heater portion 33b develops heat. The main controller 48 monitors the temperature of the intermediate plate 33a based on an output from the temperature sensor 41, and judges whether the intermediate plate 33a has reached a predetermined temperature (e.g., 90° C.) (Step S2). When the intermediate plate 33a is at a temperature which is lower than the predetermined temperature, the second temperature controller 46 allows a current to be supplied to the heater portion 33b so that the heater portion 33b develops heat. With the intermediate plate 33a reaching the predetermined temperature, the supply of the current to the heater portion 33b is stopped. This process is repeated, whereby the temperature of the intermediate plate 33a is kept at 90° C.

Concurrently with the operation above, at Step S3, a current is supplied to the auxiliary heating portion 32 from the power source 50, so that transfer of heat by the Peltier element increase the temperature of the substrate supporting plate 31. The main controller 48 judges whether the temperature of the substrate supporting plate 31 has reached the predetermined temperature, that is, 110° C. based on the output from the temperature sensor 40 of the substrate supporting plate 31 (Step S4). Peltier elements are capable of switching the direction of heat transfer by switching the direction of a supplied current. Therefore, the direction in which the Peltier element supplies a current is switched appropriately, to thereby adjust the temperature of the substrate supporting plate 31 to the desired temperature of 110° C.

In the temperature setting operation described above, the heater portion 33b of the main heating portion 33 and the auxiliary heating portion 32 set the temperature of the substrate supporting plate 31. It is possible to control heat transfer by the auxiliary heating portion 32 accurately in a short period of time. Hence, control of heat transfer by the auxiliary heating portion 32 is realized accurately in a shorter period of time than where the temperature of the substrate supporting plate 31 is adjusted using only a heater.

(2) High Speed Temperature Increase Operation Upon Loading of Substrate

When a substrate W is loaded on the substrate supporting plate 31 which is set to 110° C., for example, in the temperature setting operation described above, since the temperature of the substrate W is as low as a room temperature upon loading, the surface temperature of the substrate supporting plate 31 decreases dramatically. To deal with this, the high speed temperature increase operation as described below is executed, so that the surface temperature of the substrate supporting plate 31 is corrected and the substrate is set to the desired temperature.

Figure 4:
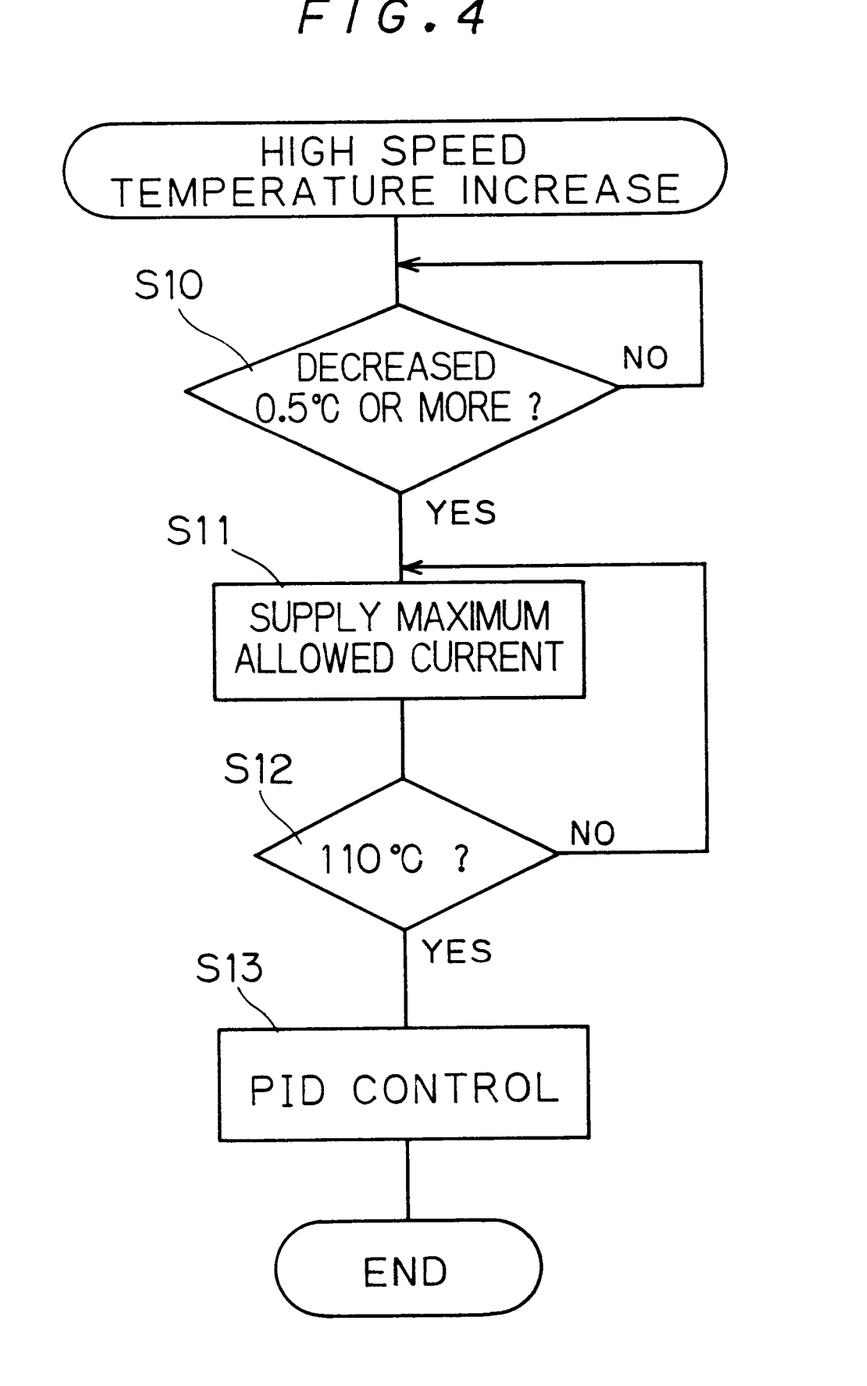
FIG. 4 is a flowchart showing a high speed temperature increase operation.
Figure 5:
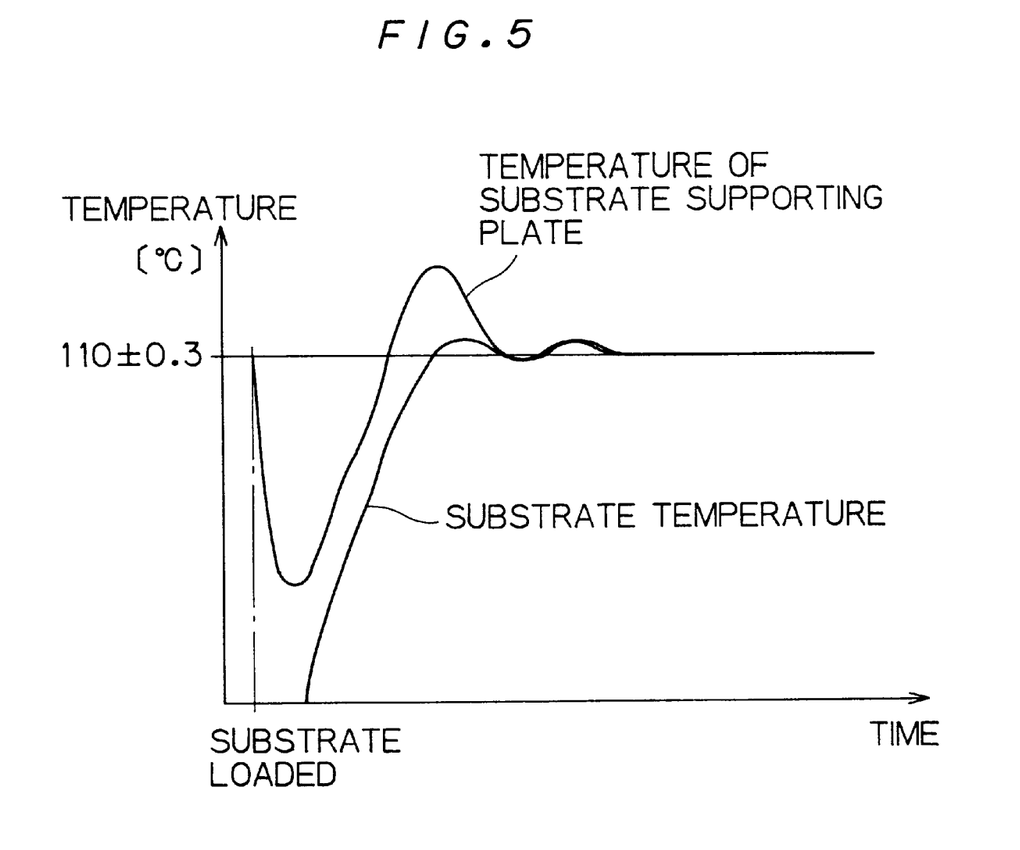
FIG. 5 is a view showing a change in the temperature of a substrate during the high speed temperature increase operation which is shown in FIG. 4.

FIG. 4 is a flowchart showing the high speed temperature increase operation in a case where the temperature of a substrate is to be controlled to 110° C.±0.3° C. FIG. 5 is a view showing a change in the temperature of the substrate.

In a condition that the substrate supporting plate 31 is controlled to 110° C., if a substrate W which is at a room temperature (about 23° C.) is loaded on the substrate supporting plate 31, as shown in FIG. 5, the temperature of the substrate supporting plate 31 decreases dramatically. To deal with this, first, whether the decrease in the temperature of the substrate supporting plate 31 is 0.5° C. or more is judged based on the output from the temperature sensor 40 (Step S10).

When a decrease in the temperature of 0.5° C. or more is detected, the first temperature controller 45 is controlled so that a maximum allowed current is supplied to the auxiliary heating portion 32. This increases the temperature of the substrate supporting plate 31 with so-called full power. The main controller 48 monitors an increasing temperature of the substrate supporting plate 31. The maximum allowed current is supplied to the auxiliary heating portion 32 until the temperature of the substrate supporting plate 31 reaches 110° C. (Step S11).

When the temperature of the substrate supporting plate 31 reaches 110° C. (Step S12), the first temperature controller 45 is switched to PID control, thereby suppressing the temperature increase operation. Following this, the temperature is increased and decreased while controlling the direction of the current which is supplied to the auxiliary heating portion 32, so that the temperature of the substrate supporting plate 31 is controlled in the range of 110° C.±0.3° C. (Step S13).

In the high speed temperature increase operation described above, since the auxiliary heating portion 32 is formed by a Peltier element, even when the temperature increase operation is executed with full power and the temperature of a substrate W overshoots, quick switching to the temperature decrease operation can adjust the temperature of the substrate W to the desired set temperature with good control in a short period of time.

(3) Set Temperature Changing (Decreasing) Operation

Next, a description will be given on an operation for a case that the set temperature for an objective substrate is lower than the set temperature for an immediately preceding substrate. The temperature of the substrate supporting plate 31 after finishing the heating processing is approximately the same as the set temperature for an immediately preceding substrate, which is 110° C., for example. In a similar manner, the temperature of the intermediate plate 33a is kept at around 90° C. Therefore, driving the cooling Peltier element 35, the temperatures of the main heating portion 33 and the substrate supporting plate 31 are lowered.

The main controller 48 makes the first temperature controller 45 and the third temperature controller 47 drive the Peltier element of the auxiliary heating portion 32 and the cooling Peltier element 35. A current is supplied to the Peltier element of the auxiliary heating portion 32 in such a manner that the heat of the substrate supporting plate 31 is transferred toward the main heating portion 33, while a current is supplied to the cooling Peltier element 35 in such a manner that the heat of the main heating portion 33 is transferred toward the water cooling jacket 36. This transmits the heat of the substrate supporting plate 31 to the water cooling jacket 36 through the auxiliary heating portion 32, the main heating portion 33 and the cooling Peltier element 35. The transmitted heat is discharged outside by cooling water which circulates in the cooling water channel 37 of the water cooling jacket 36. This rapidly decreases the temperature of the substrate supporting plate 31. The cooling water in the water cooling jacket 36 may circulate all the times.

As described above, as the cooling Peltier element 35 and the water cooling jacket 36 are disposed to the bottom surface of the main heating portion 33, it is possible to quickly decrease the temperature of the substrate supporting plate 31 which was increased to the set temperature. Therefore, even when a substrate for which the set temperature for the heating processing is high and a substrate for which the set temperature for the heating processing is low are supplied continuously, it is possible to promptly change the temperature of the top surface of the substrate supporting plate 31 for the purpose of the heating processing.

Figure 6:
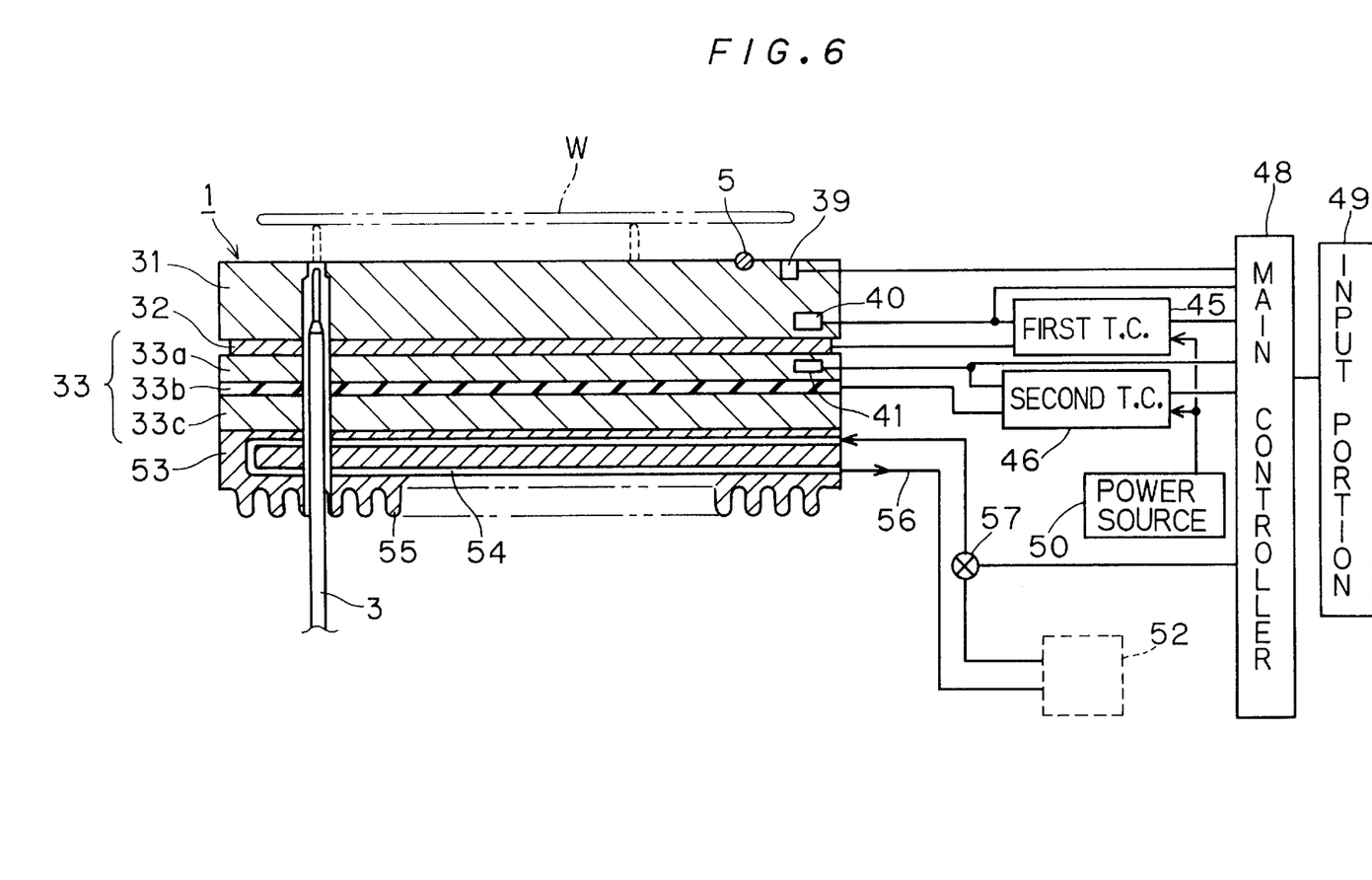
FIG. 6 is a cross sectional view of a heating plate according to a second preferred embodiment of the present invention.

FIG. 6 is a cross sectional view of a heating plate according to a second preferred embodiment of the present invention. The heating plate 1 according to the preferred embodiment which is shown in FIG. 6 is different from the heating plate 1 which is shown in FIG. 2 in terms of the structure of the cooling means of the main heating portion 33. That is, an air cooling jacket 53 is disposed to the bottom surface of the heat radiating plate 33c of the main heating portion 33. In the air cooling jacket 53, an air path 54 for passing compressed air inside a plate-like shaped member which has an excellent heat transfer characteristic is formed. The air path 54 is connected to an air supply facility 52 of a factory in which the substrate heating apparatus is installed, through a circulating pipe 56. Disposed midstream in the circulating pipe 56 is a switch control valve 57. As the switch control valve 57 opens and closes, supply of compressed air to the air path 54 of the air cooling jacket 53 is controlled. Further, a heat radiation fin 55 is disposed to a bottom surface of the plate-like shaped member of the air cooling jacket 53.

The air cooling jacket 53 operates during the temperature decrease operation of the substrate supporting plate 31. When the temperature of the substrate supporting plate 31 is to be decreased, the main controller 48 opens the switch control valve 57, whereby compressed air is supplied to the air path 54 of the air cooling jacket 53 and circulated. The heat of the substrate supporting plate 31 transmits to the air cooling jacket 53 through the main heating portion 33, and is discharged outside by the compressed air 54. This quickly decrease the temperature of the substrate supporting plate 31 down to the predetermined temperature.

In the structure above of the substrate heating apparatus, the substrate supporting plate 31 corresponds to the substrate supporting stage according to the invention, the main heating portion 33 corresponds to the heating portion according to the invention, the air cooling jacket 53 corresponds to the cooling portion and the cooling member according to the invention, and the auxiliary heating portion 32 corresponds to the first heat exchange means. Further, the main heating portion 33 of the heating plate 1 according to the first and the second preferred embodiments described above may use heat generating member in which a heater is buried inside a plate-like shaped heat transferring member.

While the invention has been described in detail, the foregoing description is in all aspects illustrative and not restrictive. It is understood that numerous other modifications and variations can be devised without departing from the scope of the invention.

We claim:

1. An apparatus for performing thermal processing on a substrate, comprising:

a supporting stage for supporting a substrate;

a heating portion which is disposed below said supporting stage;

a cooling portion which is disposed below said heating portion;

first heat exchange means which is disposed between said supporting stage and said heating portion, said first heat exchange means exchanging heat between said supporting stage and said heating portion; and second heat exchange means which is disposed between said heating portion and said cooling portion, said second heat exchange means exchanging heat between said heating portion and said cooling portion.

2. The apparatus of claim 1, wherein said first heat exchange means comprises a first Peltier element, and said second heat exchange means comprises a second Peltier element.

3. The apparatus of claim 1, wherein said cooling portion comprises a cooling member which contacts a bottom surface of said second heat exchange means, a pipe being formed through said cooling member, and said apparatus further comprises coolant supply means which supplies a coolant to said pipe.

4. The apparatus of claim 3, wherein said coolant is water.

5. The apparatus of claim 1, further comprising:

a first temperature sensor for measuring the temperature of said supporting stage;

a second temperature sensor for measuring the temperature of said heating portion; and heating control means which controls, in response to each one of output signals from said first and said second temperature sensors, heat generation at said heating portion.

6. The apparatus of claim 5, wherein said first heat exchange means comprises a first heat exchange element which can switch a heat transfer direction between said supporting stage and said heating portion, said second heat exchange means comprises a second heat exchange element which can switch a heat transfer direction between said heating portion and said cooling portion, and said apparatus further comprises:

first heat transfer control means which drives said first heat exchange element in response to each one of said output signals from said first and said second temperature sensors, to thereby control said heat transfer direction between said supporting stage and said heating portion; and second heat transfer control means which drives said second heat exchange element in response to each one of said output signals from said first and said second temperature sensors, to thereby control said heat transfer direction between said heating portion and said cooling portion.

* * * * *